United States Patent
Wu et al.

(10) Patent No.: US 11,947,828 B2
(45) Date of Patent: Apr. 2, 2024

(54) MEMORY DEVICE

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Jun-Shen Wu, Hsinchu (TW); Chi-En Wang, Hsinchu (TW); Ren-Shuo Liu, Hsinchu (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 7 days.

(21) Appl. No.: 17/407,953

(22) Filed: Aug. 20, 2021

(65) Prior Publication Data

US 2022/0066680 A1 Mar. 3, 2022

Related U.S. Application Data

(60) Provisional application No. 63/070,907, filed on Aug. 27, 2020.

(51) Int. Cl.
*G06F 3/06* (2006.01)
(52) U.S. Cl.
CPC .......... *G06F 3/0653* (2013.01); *G06F 3/0619* (2013.01); *G06F 3/0679* (2013.01)

(58) Field of Classification Search
None
See application file for complete search history.

(56) References Cited

U.S. PATENT DOCUMENTS

| 2014/0258593 | A1* | 9/2014 | Strauss | G11C 13/0004 365/45 |
| 2015/0033064 | A1* | 1/2015 | Davis | G11C 16/3454 714/37 |
| 2018/0330239 | A1* | 11/2018 | Chen | G06N 3/00 |
| 2019/0079727 | A1* | 3/2019 | Chen | G06N 3/084 |

(Continued)

OTHER PUBLICATIONS

Chi-En WANG, "Neural Network Computation Using Low Bitwidth Numbers and Low Power Memory", Master Thesis of National Tsing Hua University, Aug. 2019.

(Continued)

*Primary Examiner* — Yaima Rigol
*Assistant Examiner* — Alexander J Yoon
(74) *Attorney, Agent, or Firm* — Maschoff Brennan

(57) ABSTRACT

A memory device is disclosed, including a memory array and a selection circuit. At least one first faulty cell and at least one second faulty cell that are in the memory array store data corresponding to, respectively, first and second fields of a floating-point number. The selection circuit identifies the at least one first faulty cell and the at least one second faulty cell based on a priority of a cell replacement operation which indicates that a priority of the at least one first faulty cell is higher than that of the at least one second faulty cell. The selection circuit further outputs a fault address of the at least one first faulty cell to a redundancy analyzer circuit for replacing the at least one first faulty cell.

20 Claims, 8 Drawing Sheets

(56) References Cited

U.S. PATENT DOCUMENTS

2019/0180182 A1* 6/2019 Loh .................. G06F 30/30
2021/0287095 A1* 9/2021 Lin .................. G06F 7/5443

OTHER PUBLICATIONS

Jun-Shen Wu et al., "Value-Aware Error Detection and Correction for SRAM Buffers in Low-Bitwidth, Floating-Point CNN Accelerators", ACM Student Research Competition at ICCAD 2020, Nov. 2, 2020.

Jun-Shen Wu et al., "Value-Aware Error Detection and Correction for SRAM Buffers in Low-Bitwidth, Floating-Point CNN Accelerators", 26th Asia and South Pacific Design Automation Conference, Jan. 18-21, 2021.

Thierry Tambe et al., "Adaptivfloat: a Floating-Point Based Data Type for Resilient Deep Learning Inference", arXiv:1909.13271v3 [cs.LG] Feb. 11, 2020.

Thierry Tambe et al., "Algorithm-Hardware Co-Design of Adaptive Floating-Point Encodings for Resilient Deep Learning Inference" 2020 57th ACM/IEEE Design Automation Conference (DAC), Jul. 19-23, 2020.(.

Lita Yang et al., "Bit Error Tolerance of a CIFAR-10 Binarized Convolutional Neural Network Processor" IEEE International Symposium on Circuits and Systems (ISCAS), May 2018.

Lita Yang et al., "SRAM Voltage Scaling for Energy-Efficient Convolutional Neural Networks" 18th International Symposium on Quality Electronic Design (ISQED), Mar. 2017.

* cited by examiner

MEMORY DEVICE

CROSS REFERENCE

The present application claims priority to U.S. Provisional Application No. 63/070,907, filed on Aug. 27, 2020, which is herein incorporated by reference in its entirety.

BACKGROUND

Low-power convolutional neural networks (CNN) accelerator is considered as a key technique of constructing the future artificial intelligence world. Dynamic voltage scaling is an essential low-power strategy, but it is bottlenecked by on-chip SRAM, which exhibits stuck-at faults when the supply voltage is low.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
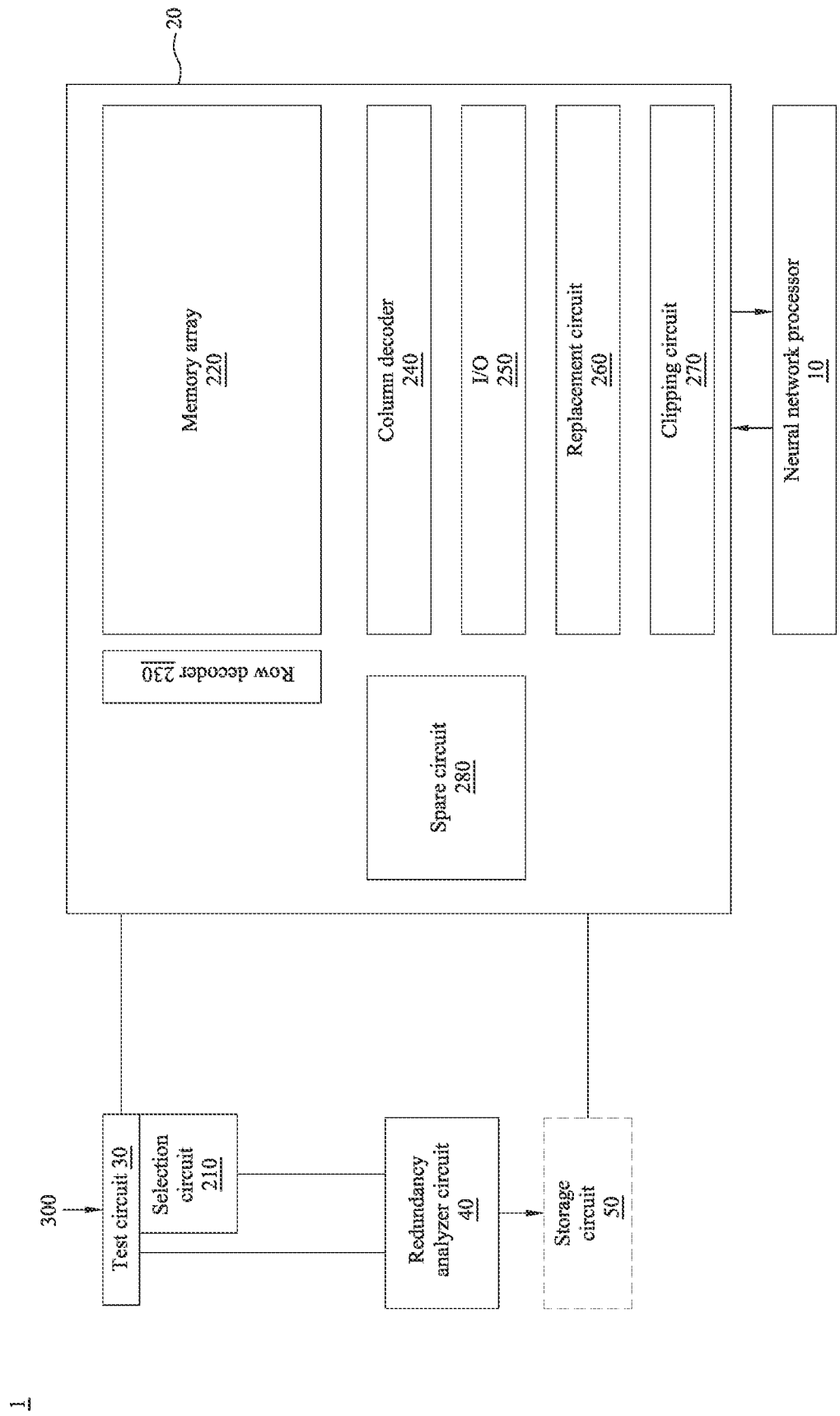
FIG. 1 is a schematic diagram of a system in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

In some approaches, the supply voltage of SRAM device is as low as 0.5 Volts to achieve the maximum power saving. However, the incurred bitcell failure rate of memory device under low voltage ruins the accuracy of a low-bitwidth (e.g., 8 bit) floating-point convolutional neural networks (CNN) accelerator which accesses data from the SRAM device. In some embodiments, the present disclosure provides configurations of a value-aware error-detecting boundary for verifying the output of the memory device before being transmitted to a neural network model and configurations of a value-aware error-correcting pointer for selectively replacing faulty cells in the memory device according to a priority of replacement. Accordingly, improved performance, such as operating speed, power consumption, accuracy, etc., is provided.

Reference is now made to FIG. 1. FIG. 1 is a schematic diagram of a system 1 in accordance with various embodiments of the present disclosure. For illustration, the system 1 includes a neural network processor 10, a memory device 20, a test circuit 30, a redundancy analyzer circuit 40, and a storage circuit 50. As shown in FIG. 1, in some embodiments, the neural network processor 10 accesses data in the memory device 20. The test circuit 30 is coupled to the memory device 20 for performing a memory test on the memory device 20. The redundancy analyzer circuit 40 is coupled between the test circuit 30 and the storage circuit 50 while the storage circuit 50 is coupled to the memory device 20. In some embodiments, the system 1 further includes a selection circuit 210 coupled between the test circuit 30 and the redundancy analyzer circuit 40.

In some embodiments, the neural network processor 10 includes one or more processing blocks (e.g., computer processing units), a neural network model, an operation controller which controls operations between the processing blocks, and a high bandwidth fabric (e.g., data bus passing data and/or data elements between a neural network model and cooperating components of the neural network processor 10). The neural network model refers to a computational architecture and is implemented/executed within the operation controller and the processing blocks in the neural network processor 10. Specifically, the neural network processor 10 as a computer-based utility is capable of processing a description, e.g., a programmatic description, of the neural network model to generate and execute a sequence of instructions, and further parses the instructions and controls operation of the processing units included within the neural network processor 10 to execute the neural network model. In the embodiments of the present disclosure, the neural network model in the neural network processor 10 includes a convolutional neural network (CNN). In some embodiments, the neural network processor 10 is implemented as a semiconductor integrated circuit. In various embodiments, the neural network processor 10 is implemented as a programmable integrated circuit such as a field programmable gate array. In other example embodiments, the neural network processor 10 is implemented as a custom integrated circuit or an application specific integrated circuit.

In some embodiments, the neural network processor 10 fetches the read data RD including, for example, input data (referred to as input activations) and weights from the memory device 20. The input activations are input feature maps or portions thereof called regions for implementing feature extraction layers of the neural network model. The input activations are values for implementing feature classification layers of the neural network model. The input data are intermediate data generated during implementation of feature extraction and/or feature classification layers. In various embodiments, the neural network processor 10 stores the input activations and weights within the memory device 20.

For illustration, the memory device 20 includes a memory array 220, a row decoder 230, a column decoder 240, an input/output circuit (also known as sense amplifier (SA)) 250, a replacement circuit 260, a clipping circuit 270, and a spare circuit 280. In operation, data is written into the memory array 220 or fetched out from the memory array 220 in response an address ADDR decoded by the row decoder 230 and the column decoder 240, and further is transmitted through the input/output circuit 250. In some embodiments, when a memory cell in the memory array 220 fails to store an accurate logic value, the replacement circuit 260 is configured to replace said faulty cell with a redundant cell in the memory array 220 or in the spare circuit 280. The clipping circuit 270 is configured to compare the data read out from the memory array 220 with a first threshold value and a second threshold value smaller than the first threshold value, and to output the data, the first threshold value, or the second threshold value to the neural network processor 10.

The test circuit 30 is configured to receive data 300 and further perform a test operation on the memory array 220 with the data 300 and address patterns corresponding to memory cells in the memory array 220. In some embodiments, the data 300 includes the format and mapping to the memory device 20 of input activations and weights that are used in the neural network model, for example, floating-point numbers in binary representation with three fields, namely, 1-bit sign, 3-bit exponent, and 4-bit mantissa. The configurations of the data 300 are given for illustrative purposes. Various configurations of the data 300 are within the contemplated scope of the present disclosure. For example, the data 300 includes the format of a 32-bit floating-point number having 1-bit sign, 8-bit exponent, and 23-bit mantissa. In various embodiments, the data 300 includes the format of 1-bit sign and n-bit exponent without the mantissa field. In some embodiments, the data 300 includes the format of n-bit exponent and m-bit mantissa without the sign bit. A person who is skilled in the art may utilize suitable floating-point number to implement the present disclosure according to the actual practice.

In some embodiments, the test circuit 30 generates data, writes data into the memory 220, and compares data read out from the memory array 220 with the generated data to identify faulty cells in the memory array 220, and outputs test results including fault type and/or addresses of corresponding faulty cells to the selection circuit 210. The selection circuit 210 outputs one or more address in the addresses of faulty cells to the redundancy analyzer circuit 40 for replacing one or more faulty cells with redundant cells. In some embodiments, the redundancy analyzer circuit 40, the storage circuit 50, the replacement circuit 260, and the spare circuit 280 are configured to cooperate for faulty cells replacement. The detailed operations of the system 1 will be discussed in the following paragraphs.

In some embodiments, the selection circuit 210 and the redundancy analyzer circuit 40 are implemented by logic circuits to perform data comparison operations, data storage, data analysis, or any control operations in the memory device 20.

The configurations of FIG. 1 are given for illustrative purposes. Various implements are within the contemplated scope of the present disclosure. For example, in some embodiments, the clipping circuit 270 is integrated in the neural network processor 10.

Figure 2:
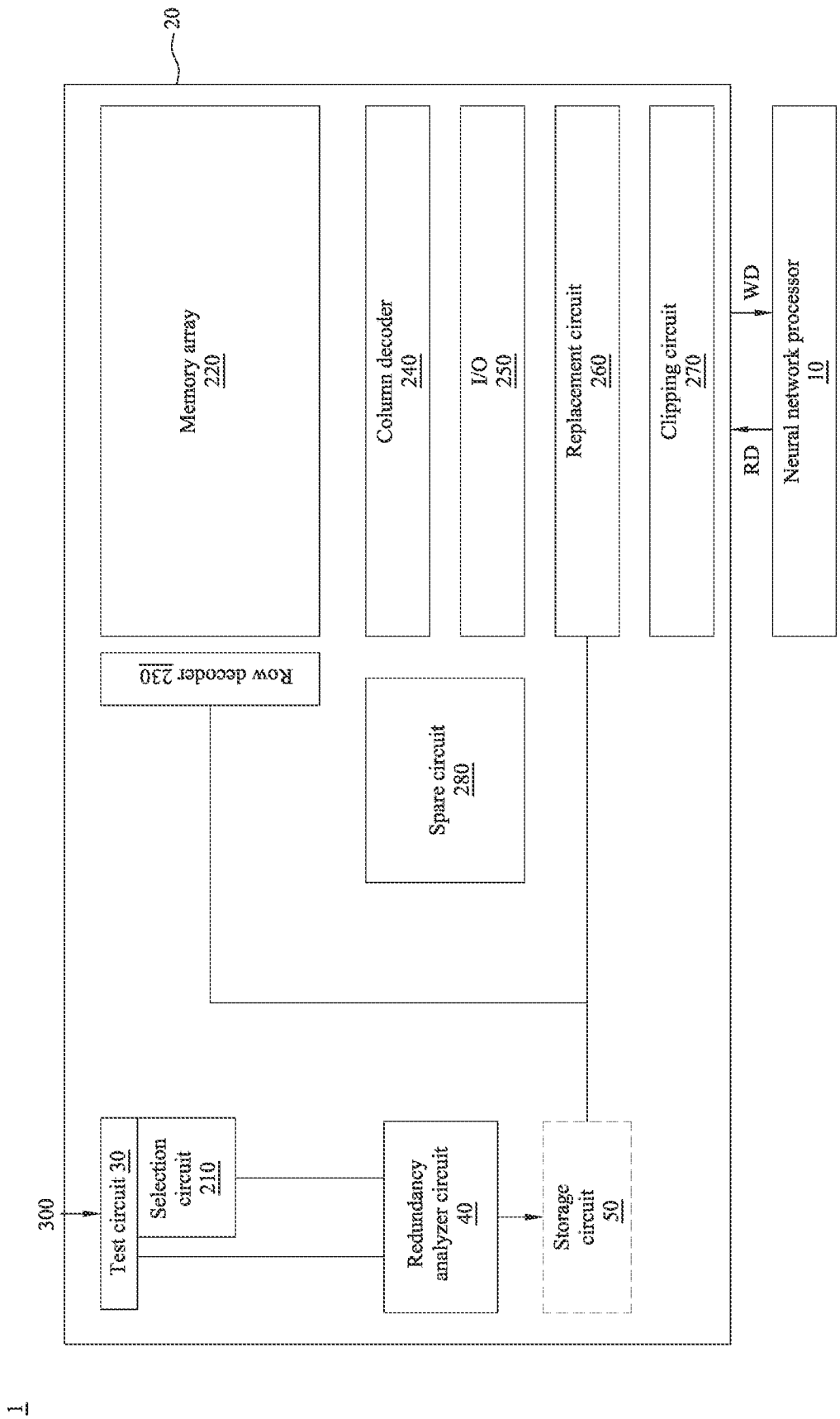
FIG. 2 is a schematic diagram of the system in accordance with other embodiments of the present disclosure.

Reference is now made to FIG. 2. FIG. 2 is a schematic diagram of the system 1 in accordance with other embodiments of the present disclosure. Compared with FIG. 1, the test circuit 30, the redundancy analyzer circuit 40, the storage circuit 50, and the selection circuit 210 are integrated within the memory device 20. In some embodiments, the test circuit 30 is a memory built-in self test (BIST) circuit and the redundancy analyzer circuit 40 is a memory built-in redundancy analysis (BIRA) circuit. In various embodiments, the test circuit 30 is configured to generate an internal command and an internal address for writing and reading of preset data for the memory device 20 and for controlling the comparison with expected value data, without receiving data from the neural network processor 10.

The configurations of FIG. 2 are given for illustrative purposes. Various implements are within the contemplated scope of the present disclosure. For example, in some embodiments, the selection circuit 210 is integrated in the test circuit 30. In another embodiment, the selection circuit 210 is integrated in the redundancy analyzer circuit 40.

Figure 3:
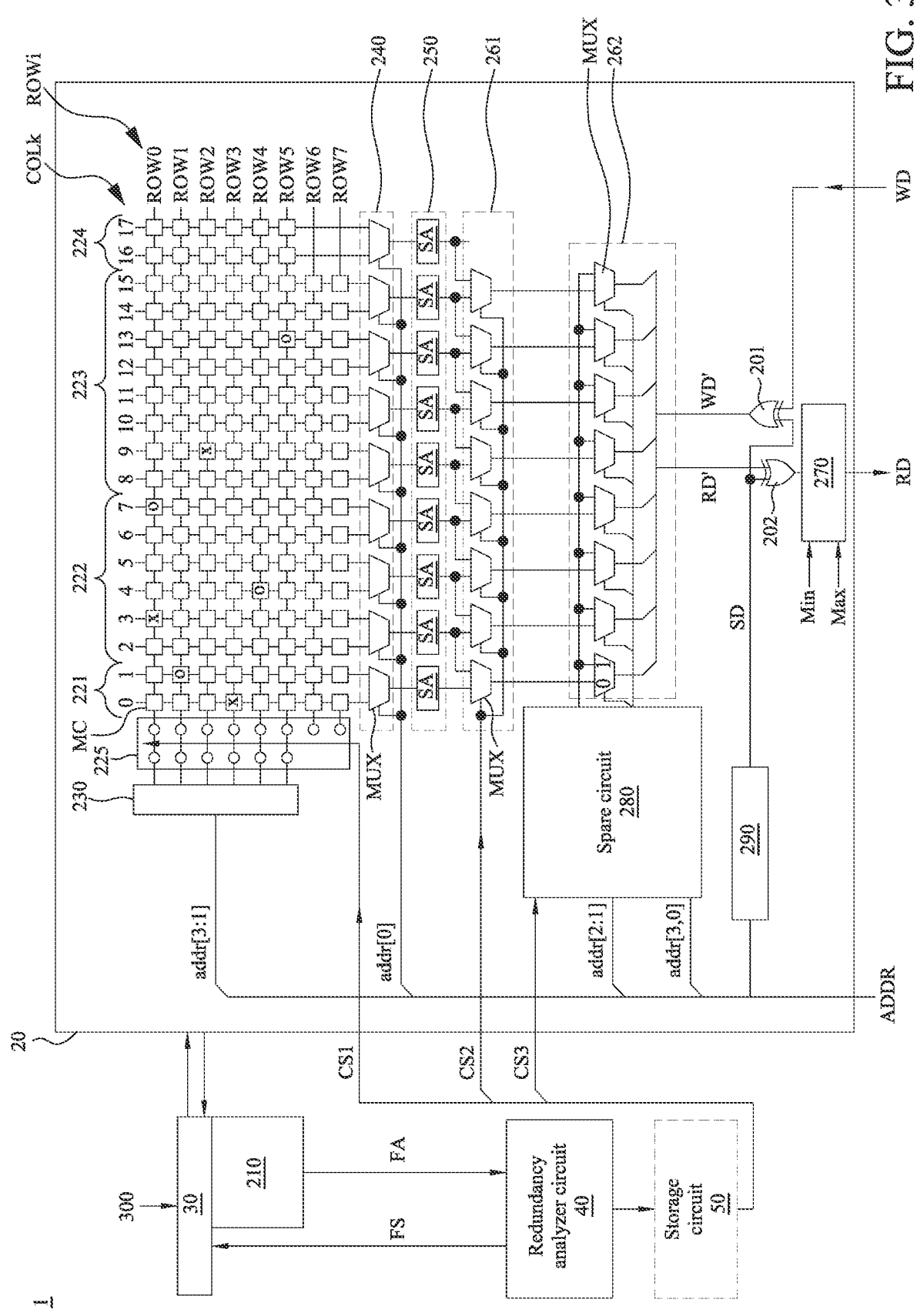
FIG. 3 is a schematic diagram of the system corresponding to FIGS. 1-2 in accordance with various embodiments of the present disclosure.

Reference is now made to FIG. 3. FIG. 3 is a schematic diagram of the system 1 corresponding to FIGS. 1-2 in accordance with other embodiments of the present disclosure.

For illustration, the memory array 220 includes memory cells MC arranged in rows ROW0-ROW7 and columns COL0-COL17 for storing binary numbers corresponding to data transmitted from/to the neural network processor 10, namely, activations and weights, which correspond to the data 300. Specifically, the memory array 220 includes a first group of memory cells 221 storing 1-bit data corresponding to sign field, a second group of memory cells 222 storing 3-bit data corresponding to exponent field, a third group of memory cells 223 storing 4-bit data corresponding to mantissa field of floating-point numbers of the data 300. In some embodiments, the memory cells MC are coupled to the row decoder 230 through a switching circuit 225 and coupled to the column decoder 240 through several multiplexers MUX. Accordingly, while the column decoder 240 operates in response to a bit addr[0] of the address ADDR and the row decoder 230 operates in response to bits addr[3:1] of the address ADDR, the memory cells MC corresponding to the address ADDR are accessed for reading or writing data. In some embodiments, the memory cells MC are volatile memory cells such as SRAM, flip flop, embedded DRAM, or DRAM cells. In some embodiments, the memory cells MC are non-volatile memory cells such as NOR Flash, NAND Flash, MRAM, ReRAM, PCM cells. In some embodiments, the memory cells MC are single-level cells. In some embodiments, the memory cells MC are multi-level cells.

As shown in the embodiments of FIG. 3, the memory cells MC referred to as faulty cells are marked with "O" and "X." For example, the memory cells MC marked with "X" at positions ($P_{row,column}$) $P_{0,3}$, $P_{2,9}$, and $P_{3,0}$ have a stuck-at-1 fault which indicates that the memory cells MC are not able to store a logic value "0" and always output a logic value "1." The memory cells MC, by contrast, at positions $P_{0,7}$, $P_{1,1}$, $P_{4,4}$, and $P_{5,13}$ have a stuck-at-0 fault which indicates that the memory cells MC are not able to store a logic value "1" and always output a logic value "0." Accordingly, by comparing data purposed to be written into the memory cells MC with data read out from the memory cells MC, the test circuit 30 outputs, in response to the comparison, fault types and addresses corresponding to the faulty cells as mentioned above to the selection circuit 210. In some embodiment, stuck-at faults are probabilistic. For example, the memory cells marked as having a stuck-at-1 fault can indicate that the memory cells MC have a noticeably high probability (e.g., >10%, not necessarily exactly 100%) of being not able to store a logic value "0".

In some embodiments, faulty cells in the memory device 20 are replaced based on a priority of a cell replacement operation. For instance, faulty cells assigned a first priority have features, such like, having the stuck-at-1 fault, storing exponent bit(s) of the floating-point number, the combinations thereof, or any other suitable features. Furthermore, faulty cells assigned a second priority, lower than the first priority, have features, such like, having the stuck-at-0 fault, storing sign or mantissa bit(s) of the floating-point number, the combinations thereof, or any other suitable features. In some embodiments, the faulty cells having the first priority are replaced with redundant cells before performing cell replacement to the faulty cells having the second priority.

As mentioned above, in some embodiments, the selection circuit 210 identifies the faulty cell having the first priority and the faulty cell having the second priority based on a priority of a cell replacement operation. Specifically, the selection circuit 210 selects faulty cells having the stuck-at-1 fault based on the test result received from the test circuit 30, and further identifies, according to the address of the faulty cell, the type of data bit stored in the faulty cell. For example, as shown in FIG. 3, the memory cells MC with marks "X" at the positions $P_{0,3}$, $P_{2,9}$, and $P_{3,0}$ are selected. When the second group of memory cells 222 store data corresponding to exponent field, the selection circuit 210 stores addresses corresponding to the second group of memory cells 222. Accordingly, among the memory cells MC with marks "X," the memory cell MC at the position $P_{0,3}$ is determined by the selection circuit 210 when the address of the faulty cell matches one of the addresses corresponding to the second group of memory cells 222.

In response to the identification mentioned above, the selection circuit 210 further outputs a fault address FA of the faulty cell, for example, the address of the memory cell MC at the position $P_{0,3}$, to the redundancy analyzer circuit 40 for replacing the faulty cell, as shown in FIG. 3. In some embodiments, the redundancy analyzer circuit 40 transmits a signal FS indicating that the cell replacement operation to the faulty cell is finished.

In some embodiments, the redundancy analyzer circuit 40 receives the fault address FA to be replaced with one of multiple spare memory cell rows, two of spare memory cell columns, or one of multiple spare memory cells in the spare circuit 280 according to one of reconfigurations of the cell replacement operation stored in the storage circuit 50.

For example, in some embodiments, the redundancy analyzer circuit 40 replaces fault address FA corresponding to the memory cell MC at the position $P_{0,3}$ with one of the spare memory cells rows ROW6-ROW7 by controlling the switching circuit 225 with a control signal CS1. Accordingly, a data assigned to be written to the memory cell MC at the position $P_{0,3}$ is stored in one memory cell in said spare memory cell row. Alternatively stated, the faulty cell is replaced by a redundant and normally-functioning cell.

Similarly, in various embodiments, the redundancy analyzer circuit 40 replaces fault address FA corresponding to the memory cell MC at the position $P_{0,3}$ with one of the spare memory cells columns COL16-COL17 in a region 224 by controlling a multiplexer circuit 261 with a control signal CS2. Accordingly, a data assigned to be written to the memory cell MC at the position $P_{0,3}$ is stored in one memory cell in said spare memory cell column. In some embodiments, the multiplexer circuit 261 is included in the replacement circuit 260 in FIGS. 1-2.

Moreover, in various embodiments, the redundancy analyzer circuit 40 replaces fault address FA corresponding to the memory cell MC at the position $P_{0,3}$ with one of the spare memory cells in the spare circuit 280 by controlling the spare circuit 280 with a control signal CS3. The operations of the spare circuit 280 are discussed in detail with reference to FIG. 4.

The configurations of FIG. 3 are given for illustrative purposes. Various implements are within the contemplated scope of the present disclosure. For example, in some embodiments, the system 1 includes merely one reconfiguration for cell replacement.

Figure 4:
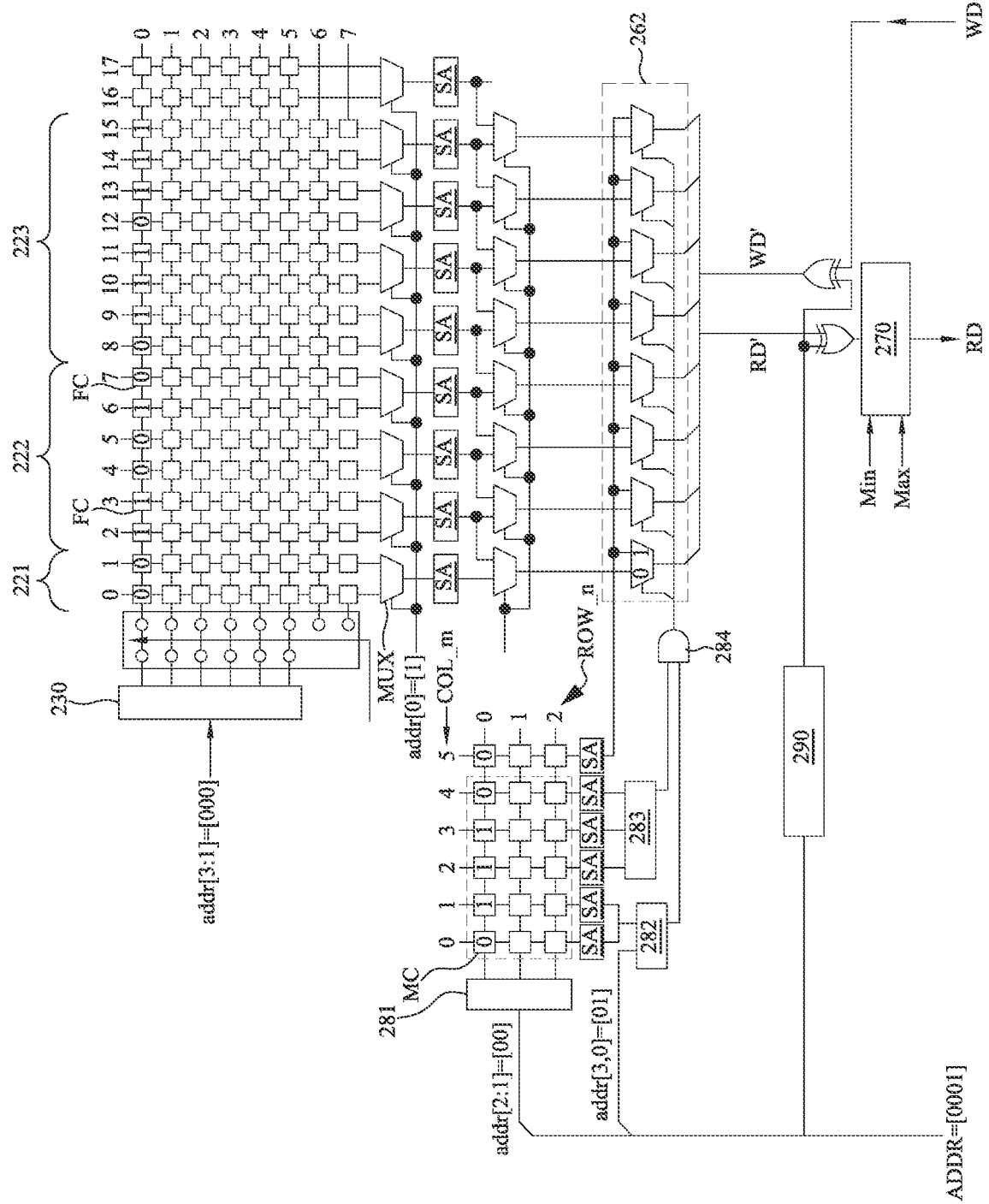
FIG. 4 is a schematic diagram of the memory device 20 corresponding to FIGS. 1-2 in accordance with various embodiments of the present disclosure.

Reference is now made to FIG. 4. FIG. 4 is a schematic diagram of the memory device 20 corresponding to FIGS. 1-2 in accordance with various embodiments of the present disclosure.

For illustration, a binary number is stored in the row ROW0 as shown in FIG. 4, while the memory cell MC (marked as a faulty cell FC) at the position $P_{0,3}$ has the stuck-at-1 fault and the memory cell MC (e.g., the faulty cell FC) at the position $P_{0,7}$ has the stuck-at-0 fault. Correspondingly, without the faulty cells being replaced, 8-bit binary number [01001111] is read out from the input/output circuit 250 with the faulty fifth bit (i.e., "0") and the faulty seventh bit (i.e., "1") in response to the odd columns (columns COL1, COL3, COL5, COL7, COL9, COL11, COL13, COL15) being activated.

As aforementioned discussions, compared with the memory cell MC at the position $P_{0,7}$, the memory cell MC at the position $P_{0,3}$ has higher priority to be replaced. In FIG. 4, an embodiment with the reconfiguration triggered by the control signal CS3 is given. The spare circuit 280 receives the control signal CS3 and is coupled to a multiplexer circuit 262 for correcting the faulty floating-point number read out from the input/output circuit 250. In some embodiments, the multiplexer circuit 262 is included in the replacement circuit 260 of FIGS. 1-2. Specifically, as shown in FIG. 4, the spare circuit 280 includes memory cells MC arranged in columns COLM_0-COLM_5 and rows ROW_0-ROW_2, multiple sense amplifiers SA, a row decoder 281, a determination circuit 282, a decoder 283, and multiple AND gates 284 respectively coupled to the multiplexer circuit 262.

In some embodiments, the control signal CS3 includes information indicating the position of the faulty cell. In operation, the address ADDR (e.g., [0001]) is sent to the memory device 20. The decoder 230 receives the bits addr[3:1] (e.g., [000]) to activate the memory cells MC in the row ROW0. The column decoder 240 receives the bits addr[0] (e.g., [1]) for reading out the binary number from the memory array 220. The bits addr[2:1] (e.g., [00]) is decoded by the row decoder 281 to access the memory cells MC in the row ROW_0 in order to save in the columns COL_0 and COL_1 values of the bits addr[3,0] (e.g., [01]), in the columns COL_2 to COL_4 3-bit data (110) corresponding to a bit position (i.e., 7-th) of the faulty seventh bit (i.e., "1"), and in the column COL_5 1-bit data corresponding to an expected logic value (i.e., an accurate value "0"). The determination circuit 282 is configured to output logic high values when read data from the memory cells MC in the columns COL_0 and COL_1 equal to the bits addr[3,0]. The AND gate 284 is configured to transmit a signal based outputs of the determination circuit 282 and the decoder 283 to the multiplexer circuit 262 to turn on a corresponding multiplexer MUX in order to replace the faulty bit with the expected logic value from the memory cell in the column COL_5 and the row ROW_0 of the spare circuit 280. As the embodiment mentioned above, a corrected 8-bit binary number [00001111] is obtained and output as a read data RD' from the multiplexer circuit 262. Alternatively stated, the spare circuit 280 replaces the faulty bit corresponding to the faulty cell with the accurate value.

In some embodiments, the read data RD' is transmitted to the clipping circuit 270 through a XOR gate 202 as shown in FIGS. 3-4. The clipping circuit 270 compares the read data RD' with threshold values Min and Max and outputs, in response to the comparison, one of the threshold values Min and Max, the read data RD', or the read data RD' with a corrected sign bit as the read data RD.

Figure 5:
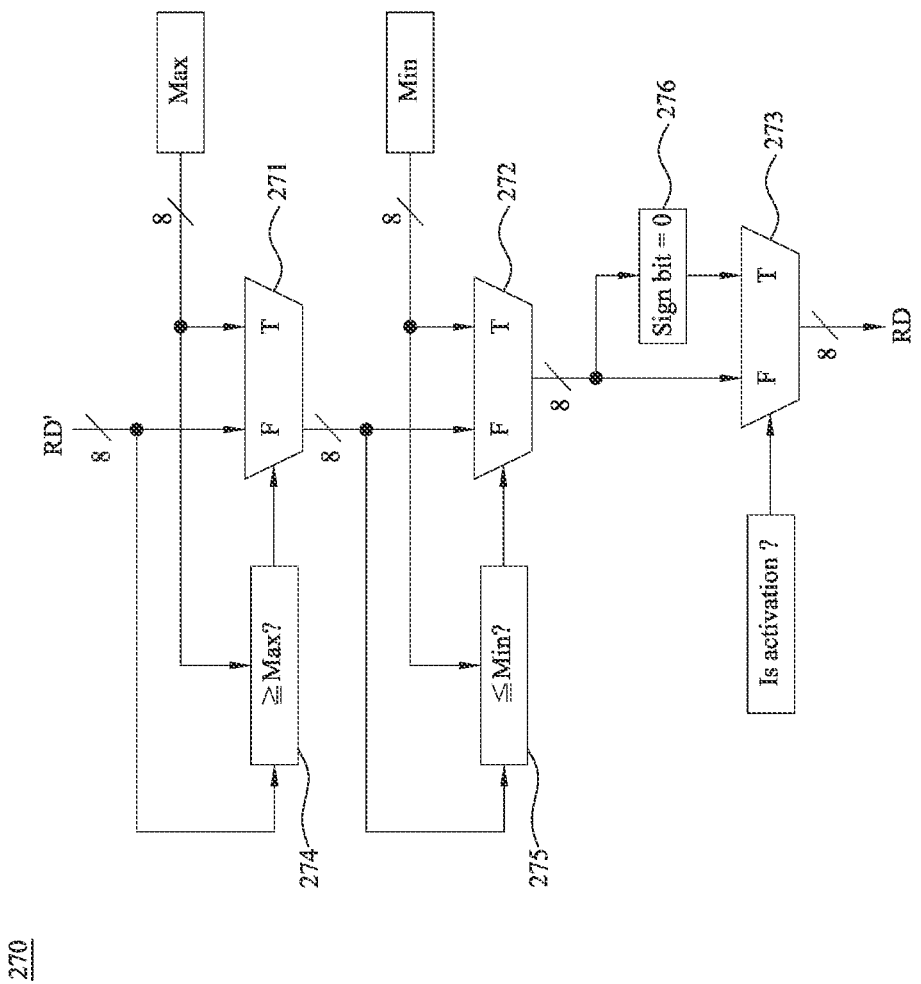
FIG. 5 is a schematic diagram of a clipping circuit in accordance with various embodiments of the present disclosure.

Reference is now made to FIG. 5. FIG. 5 is a schematic diagram of the clipping circuit 270 in accordance with various embodiments of the present disclosure. For illustration, the clipping circuit 270 includes multiplexers 271-273 and determination circuits 274-276. A signal including the threshold value Max is transmitted to the multiplexer 271 and the determination circuit 274. The determination circuit 274 determines whether the read data RD' is greater or equal to the threshold value Max. When the result of the determination is true, the clipping circuit 270 outputs the threshold value Max as the read data RD.

A signal including the threshold value Min is transmitted to the multiplexer 272 and the determination circuit 275. When the read data RD' is smaller than the threshold value Max, the determination circuit 275 determines whether the read data RD' is smaller than or equal to the threshold value Min. When the result of the determination is true, the clipping circuit 270 outputs the threshold value Min as the read data RD. When the read data RD' ranges between the threshold values Max and Min, the read data RD' is output as the read data RD.

In some embodiments, the read data RD' is determined to be used as an input activation in the neural network processor 10. The clipping circuit 270 further checks whether the sign bit is "0" (i.e., whether the read data RD' represents a positive number) by the determination circuit 276. When the sign bit is "1", the clipping circuit 270 outputs the read data RD' with the corrected sign bit("0") as the read data RD.

For example, as the embodiments shown in FIG. 4, when the read data RD is used as an input activation in the neural network processor 10, the threshold value Min is a binary number [00000000] (decimal value is 0,) and the threshold value Max is a binary number [01010011]. The clipping circuit 270 determines that the read data RD' ranges between the threshold values Max and Min, and accordingly, outputs the read data RD' [00001111] as the read data RD.

In various embodiments, the read data RD' is a binary number [10001111] with an inaccurate sign bit (e.g., the memory cell MC at the position $P_{0,1}$ in FIG. 4 has the stuck-at-1 fault) while the read data RD is used as an input activation in the neural network processor 10. When the threshold values Max and Min are the same as those in the aforementioned embodiments, the clipping circuit 270 corrects the inaccurate sign bit and outputs read data RD [00001111].

In various embodiments, compared with FIG. 4, instead of the memory cells at the positions $P_{0,3}$ and $P_{0,7}$ having the stuck-at-1 fault, the memory cells at the positions $P_{0,5}$ and $P_{0,9}$ have the stuck-at-1 fault, and accordingly, a binary number [01111011] is read from the memory array 220. In the cell replacement operation, the memory cells at the positions $P_{0,5}$ storing the exponent bit of the binary number is determined to have high priority to be replace. Accordingly, the memory cells MC in the row ROW_0 in the spare circuit 280 saves in the columns COL_0 and COL_1 the bits [01], in the columns COL_2 to COL_4 3-bit data (101) corresponding to a bit position (i.e., 6-th) of the faulty seventh bit (i.e., "1"), and in the column COL_5 1-bit data corresponding to an expected logic value (i.e., an accurate value "0"). The corrected read data RD' [01011011] is output to the clipping circuit 270. Furthermore, by comparing the read data RD' with the threshold values Max [0101001] and Min [00000000], the read data RD' is determined to be greater than the threshold value Max. Accordingly, the read data RD is clipped to the threshold value Max.

In various embodiments, when the read data RD' [11011111] is output and the read data RD is used as a weight in the neural network processor 10, the clipping circuit 270 compares the read data RD' with the threshold values Max [01010011] and Min [11010101]. The read data RD' is determined to be smaller than the threshold value Min, and accordingly, the read data RD is clipped to the threshold value Min. Alternatively stated, compared with the threshold value Min being set to "0" as the read data RD is used as the input activation, the threshold value Min is available to be set to a negative number as the read data RD is used as the weight in the neural network processor 10.

In some approaches, faulty cells, including cells having stuck-at-1 or stuck-at-0 fault, are replaced without priority. Alternatively stated, in some cases, some faulty cells, which contribute significantly greater impact in the read data RD due to having stuck-at-1 fault and storing exponent data, are not repaired/replaced because of limited replacement resources in the memory device. The accuracy of the neural network model correspondingly drops. With the configurations of the present disclosure, the faulty cells having higher priority are replaced, and accordingly the accurate read data RD is obtained to be utilized in the neural network model. In addition, compared with some approaches, it requires less replacement resources in the memory device. Thus, for instance, area and cost penalty of redundant cells, complicated circuit, potentially longer latency of checking the redundant cells are avoided.

Moreover, by utilizing the clipping circuit 270, the read data RD' read out from the memory array 220 is not directly transmitted to the neural network processor 10, but is verified by the clipping circuit 270. The read data RD used in the neural network processor 10 is clipped according to the threshold values Max and Min that are determined according to the accuracy of the neural network model. Accordingly, more accurate data is provided with the configurations of the present disclosure, compared with some approaches without a circuit configured as the clipping circuit 270.

In some embodiments, as shown in FIGS. 3-4, the memory device 20 further includes a scrambling circuit 290. The scrambling circuit 290 is configured to output a scramble data SD based on the address ADDR to the XOR gates 201-202. The XOR gate 201 further generates a write data WD' based on the scrambled data and a write data WD that is purposed to be written into the memory array 220. The XOR gate 202 further transmits the scrambled read data based on the scrambled data and the read data RD' to the clipping circuit 270. In some embodiments, the scrambling circuit 290 is referred to as for encrypting and/or decrypting the write data WD, WD' and the read data RD and RD'. In various embodiments, the redundancy analyzer circuit 40 further generates the control signals CS1-CS3 according to the scrambled read data RD' and the scrambled write data WD'. In some embodiments, the test circuit 30 and the selection circuit 210 are aware of the existence of the scrambling circuit 290 and determine the priority of replacement accordingly. For example, whether a memory cell has a stuck-at-1 is determined by the difference between the write data WD and the read data RD instead of the difference between the write data WD' and the read data RD'. In some embodiments, the scrambling circuit 290 shuffles the bits between the write data WD and the write data WD' as well as the read data RD' and the read data RD, and the test circuit 30 and the selection circuit 210 determine the priority of replacement accordingly. For example, whether a memory cell stores data corresponding to the exponent field is determined based on the write data WD and the read data RD instead of the write data WD' and the read data RD'.

The configurations of FIGS. 4-5 are given for illustrative purposes. Various implements are within the contemplated scope of the present disclosure. For example, in some embodiments, the clipping circuit 270 merely compares the read data RD' with the threshold value Max. In various embodiments, the scrambling circuit 290 is omitted in the memory device 20.

Figure 6B:
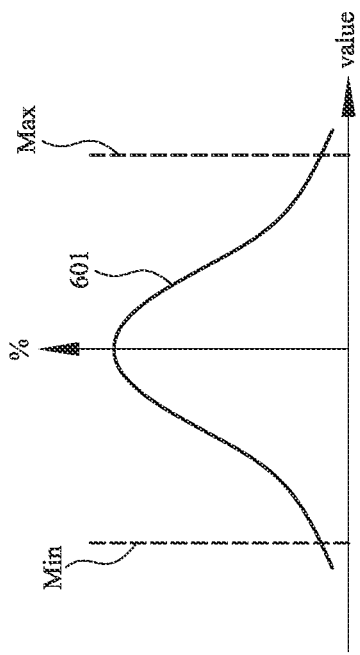
FIG. 6B is a schematic diagram of distribution of input activations in accordance with other embodiments of the present disclosure.
Figure 6A:
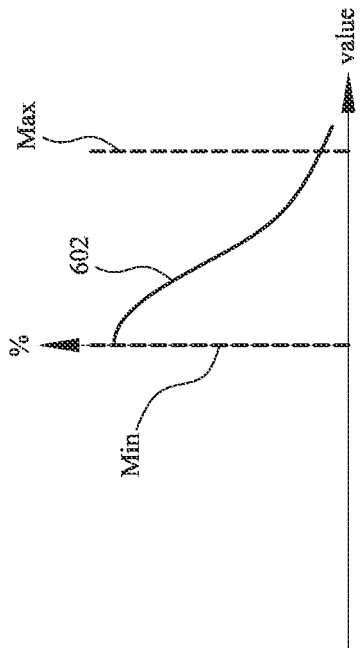
FIG. 6A is a schematic diagram of distribution of weight in accordance with other embodiments of the present disclosure.
Figure 7:
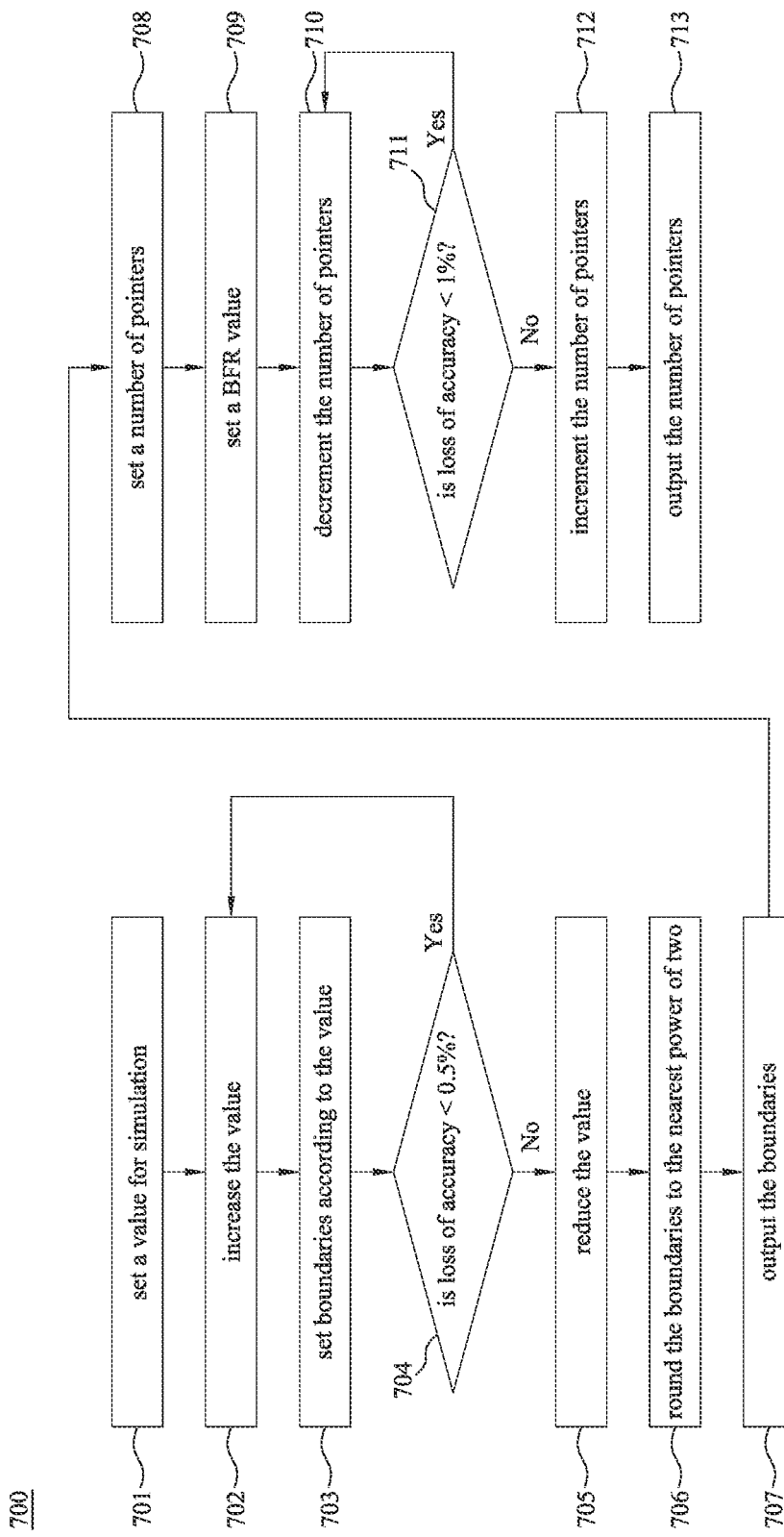
FIG. 7 is a flow chart of a method of determining threshold values in accordance with other embodiments of the present disclosure.

In some embodiments, the threshold values Min and Max are associated with distributions of the input activation and the weight that are used in the neural network processor 10. Reference is now made to FIGS. 6A-6B and 7. FIGS. 6A-6B are schematic diagrams of distribution of weights and input activations, respectively, in accordance with other embodiments of the present disclosure. FIG. 7 is a flow chart of a method 700 of determining the threshold values Max and Min in accordance with other embodiments of the present disclosure. It is understood that additional operations can be provided before, during, and after the processes shown by FIG. 7, and some of the operations described below can be replaced or eliminated, for additional embodiments of the method. The order of the operations/processes may be interchangeable. Throughout the various views and illustrative embodiments, like reference numbers are used to designate like elements. The method 700 includes operations 701-713 that are described below with reference to the system 1 of FIGS. 1-5 and the distributions in FIGS. 6A-6B.

In operation 701, a value is set for simulation of accuracy of the neural network model. In some embodiments, the value indicates that a portion of values of weights and input activations, as shown in FIGS. 6A-6B, are replaced by values of boundaries (for example, the threshold values Max and Min). In various embodiments, initially, the value is set to a relatively small number, for example, the top $10^{-5}$ percentile value. In some embodiments, for simplicity, the boundaries (for example, the threshold values Max and Min) can be directly set to the maximum and minimum values instead of a certain top percentile value.

In operation 702, the value is increased. For example, in some embodiments, the value rises tenfold.

In operation 703, boundaries, for example, the threshold values Min and Max, are set according to the value. For example, as shown in FIG. 6A, a curve 601 corresponds to the distribution of the weights. The threshold values Max and Min in the embodiments of FIG. 6A are set, respectively, to be a value the top 0.1% percentile and a value of the bottom 0.1% percentile of the distribution of the weights. In the embodiments of FIG. 6B, a curve 602 corresponds to the distribution of the input activations when a rectified linear unit (ReLU) is used in the neural network processor 10. The threshold values Max and Min are set, respectively, to be a value of the top 0.1% percentile of the distribution of the input activations and 0, due to the input activations always being positive numbers in the neural network model.

In some embodiments, after the boundaries are set and a small portion of the input activations and/or weights are inputted into the neural network model, a simulation is performed. For example, an image identification utilizing the neural network model is trained and executed with the portion of the input activations and/or weights. In some embodiments, the simulation for layers in the neural network model is performed separately.

In operation 704, based on the result of the simulation, loss of accuracy of the neural network model is determined. When the loss of accuracy is less than, for example, 0.5%, the method 700 performs the operation 702 again to increase the value for further simulation. In various embodiments, when the loss of accuracy is not less than 0.5%, the method 700 performs the operation 705.

In operation 705, the value is reduced, for example, being one tenth of the amount of the value in operation 702. Alternatively stated, the absolute values of the threshold values Max and Min increase.

As mentioned above, operations 701-705 are performed in order to find the largest percentile that impacts the accuracy (not more than 0.5%) by simulating with different values. The configurations of the values and accuracy are given for illustrative purposes. Various implements are within the contemplated scope of the present disclosure.

In operation 706, the boundaries (the threshold values) are rounded to the nearest power of two (e.g., values of exponent field). For example, in some embodiments, the threshold value Max obtained after operation 705 is 1.6, and set to be 2 in operation 706. With the configurations of the present disclosure, the clipping circuit 270 is simplified because it detects outliers (e.g., unexpected input activations and weights greater/smaller than the threshold values) by checking the exponent field.

In operation 707, the boundaries are output to the clipping circuit 270 for further comparison, as shown in FIG. 5.

In some embodiments, a lowest possible number of pointers (referred to as redundant cells for replacing faulty cells) is found by performing following operations 708-712 to make the loss in the accuracy of the neural network model less than a certain number, for example, about 1%. In operation 708, a number of pointers is set to be a relatively large number for simulation initially. In some embodiments, the number of the pointer is 15.

In operation 709, a bitcell failure rate (BFR) is set. The bitcell failure rate indicates an anticipate percentage of faulty cells in the memory array 220. In some embodiments, for instance, the BFR is about 0.1%.

In operation 710, the number of the pointer is decremented to be less than 15 and the simulation is conducted.

In operation 711, based on the result of the simulation, loss of accuracy of the neural network model is determined. When the loss of accuracy is less than, for example, 1%, the method 700 performs the operation 710 again to decrease the number of the pointers. In various embodiments, when the loss of accuracy is not less than 1%, the method 700 performs the operation 712.

In operation 712, the number of the pointers increases to be greater than that in operation 710, and is output in operation 713. Alternatively stated, a lowest possible number of pointers is found for the given BFR.

Figure 8:
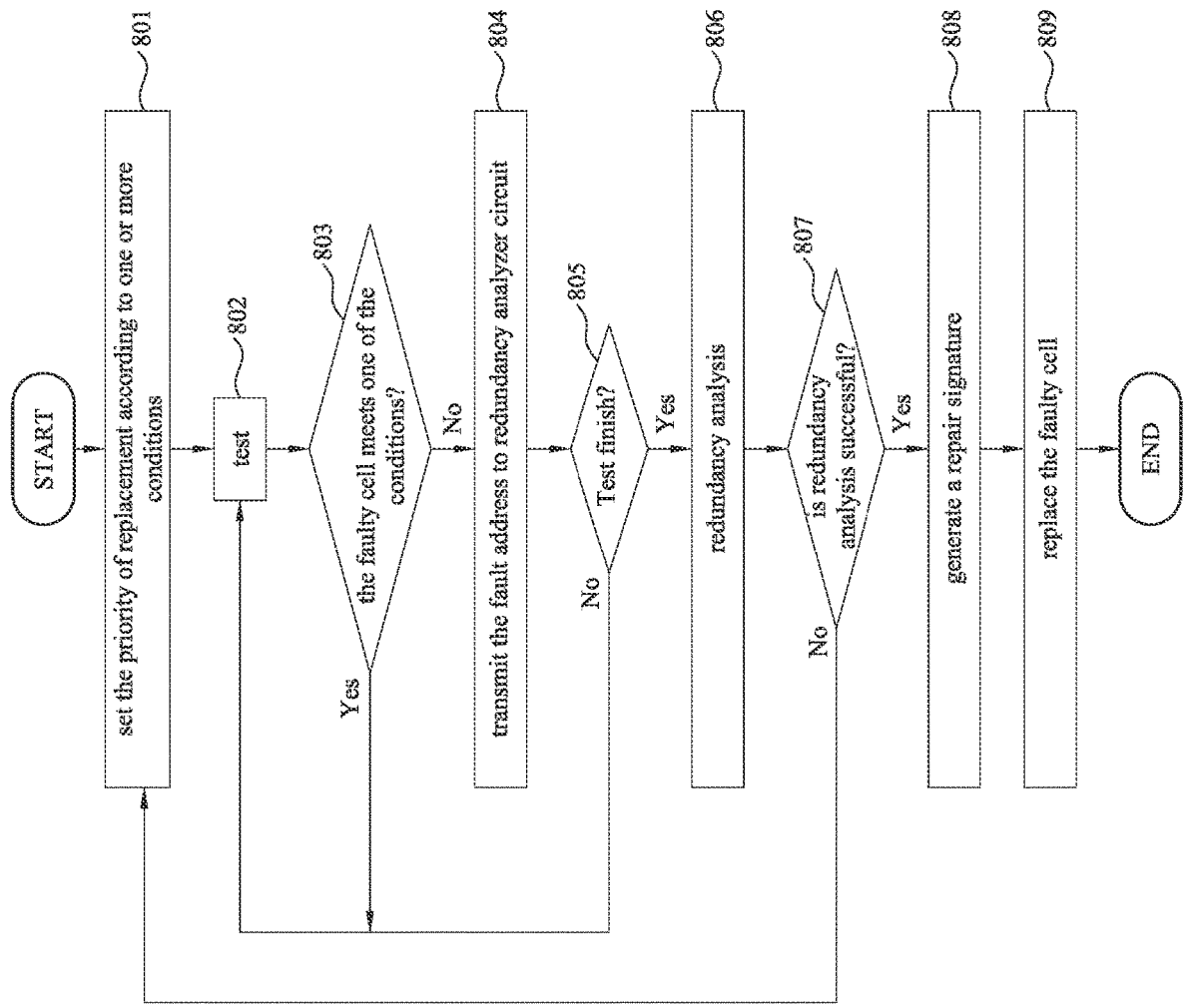
FIG. 8 is a flowchart of a method of operating a memory device, in accordance with some embodiments of the present disclosure.

Reference is now made to FIG. 8. FIG. 8 is a flowchart of a method 800 for operating a memory device, in accordance with some embodiments of the present disclosure. It is understood that additional operations can be provided before, during, and after the processes shown by FIG. 8, and some of the operations described below can be replaced or eliminated, for additional embodiments of the method. The order of the operations/processes may be interchangeable. Throughout the various views and illustrative embodiments, like reference numbers are used to designate like elements. The method 800 includes operations 801-809 that are described below with reference to the system 1 of FIGS. 1-5.

In operation 801, the priority of replacement is set according to one or more conditions for the selection circuit 210 to identify faulty cells to be replaced and faulty cells not to be replaced. In operation 802, the test circuit 30 tests the memory array 220 to identify multiple faulty cells in the memory array 220, as shown in FIG. 3. In operation 803, for faulty cells that meet one of the conditions, the selection circuit 210 determines those as excluded cells, in all of the faulty cells, having low priority and does not transmit the addresses corresponding to the excluded cells to the redundancy analyzer circuit 40, and operation 802 is performed again to check memory cells MC in the memory array 220. Moreover, for the faulty cells, the remaining cells, that do not meet the condition, the operation 804 is performed and the selection circuit 210 transmits the corresponding fault address to the redundancy analyzer circuit 40.

In some embodiments, at least one of the aforementioned conditions is associated with a value of a binary number corresponding to the excluded cells. For example, at least one condition indicates that the value of the binary number corresponding to the excluded cell is smaller than an accurate value of the binary number corresponding to the excluded cell. For illustration, with reference to FIG. 3, the value (for example, [00000000], in which the second bit is stuck at 0) of the binary number stored in the cells including a faulty cell that has the stuck-at-0 at a position $P_{5,13}$ is less than the accurate value (for example, [00000010]) of the binary number. Accordingly, the faulty cell above is identified as an excluded cell. In some embodiments, scrambling circuit 290 exists, and the value of the binary number refers to the read data RD or write data WD instead of the read data RD' or write data WD'.

In various embodiments, at least one condition indicates that a value of an exponent in the binary number corresponding to the excluded cell is smaller than an accurate value of the exponent in the binary number corresponding to the excluded cell. For example, a binary number is stored in the row ROW0 in FIG. 3, and the cell at a position $P_{0,7}$ is a stuck-at-0 faulty cell in the second group of memory cells 222 storing data corresponding to exponent field. Accordingly, a value (e.g., "0") of the exponent in the binary number is less than the accurate value (e.g., "1") of the exponent. Thus, the faulty cell above is identified as an excluded cell. Similarly, in some embodiments, scrambling circuit 290 exists, and the value of the binary number refers to the read data RD or write data WD instead of the read data RD' or write data WD'.

In various embodiments, at least one condition indicates that the excluded cell is configured to store a bit in a mantissa field of the binary number. For example, the faulty cells marked with "X" and "0" in the third group of memory cells 223 storing data corresponding to the mantissa field.

In various embodiments, at least one condition indicates that the excluded cell is configured to store a bit in a sign field of the binary number, and the binary number is used as an activation in a neural network model. For example, the faulty cells marked with "X" and "0" in the first group of memory cells 221 storing data corresponding to the sign field.

In various embodiments, at least one condition indicates that the excluded cell stores a low logic value in response to a write operation performed to write a high logic value in the excluded cell. For instance, in response to the write operation for saving logic "1," the stuck-at-0 faulty cell stores logic "0," and accordingly, the faulty cell above is identified as an excluded cell.

In another embodiment, as aforementioned discussion about the scrambling circuit 290, at least one condition indicates that the excluded cell is a stuck-at-0 faulty cell while the write data and the read data are scrambled. In yet another embodiment, at least one condition indicates that the excluded cell is in the third group of memory cells 223 storing data corresponding to the mantissa field while the write data and the read data are scrambled.

With continued reference to FIG. 8, after operation 804 is performed, in operation 805, the system 1 determines whether the test operation to the memory array 220 is finished. When the test operation continues, operation 802 is performing. In contrast, operation 806 is conducted when the test operation is finished.

In operation 806, the redundancy analyzer circuit 40 analyzes, based on, for example, the faulty address and replacement resources (e.g., the spare rows, columns, the spare circuit 280,) to determine a replacement configuration for the faulty cell.

In operation 807, the redundancy analyzer circuit 40 determines whether the redundancy analysis is successful. For example, when there is sufficient replacement resource, the redundancy analysis is determined to be successful, and operation 808 is conducted. On the contrary, operation 801 is performed to reset the condition for identifying the faulty cells supposed to be replaced.

In operation 808, the redundancy analyzer circuit 40 generates a repair signature to a corresponding component of replacement configurations. In some embodiments, the repair signature includes the control signal CS1, CS2, or CS3, as shown in FIG. 3.

In operation 809, at least one cell of the remaining cells in the faulty cells of the memory array 220 is replaced by the redundant cell according to the control signal CS1, CS2, or CS3. Alternatively stated, In some embodiments, at least one cell having the stuck-at-1 fault in the exponent field is replaced.

In some embodiments, the method 800 further includes operations of comparing a value of a binary number (e.g., the read data RD' in FIGS. 3-4) corresponding to the redundant cell with the threshold values Max and Min that are associated with, respectively, a maximum and a minimum of data used in the neural network processor 10, as shown in FIGS. 3-4.

In some embodiments, the method 800 further includes operations of outputting, in response to the comparison, the binary number, the threshold value Max, or the threshold value Min as the read data RD to the neural network processor 10, as shown in FIGS. 3-4.

In some approaches, as the bitcell failure rate surges from 0% to about 0.1% in a memory array, the accuracy of a neural network model, such like ResNet-18, ResNet-50, Inception-V3, and ShuffleNet-V2, drops significantly from above 68% to about 1%. In comparison, with the configurations of the present disclosure, the accuracy of the neural network model remains stable for the bitcell failure rate between 0% and 0.1%. For instance, in some embodiments, the aforementioned neural network model ResNet-18, ResNet-50, Inception-V3, and ShuffleNet-V2 have the accuracy ranging between around 68% and around 77% while the bitcell failure rate is about 0.1%.

As described above, the memory system in the present disclosure replaces faulty cells having various priorities based on types of faults, which saves replacement resource in the memory system. Moreover, by verifying outputs according to static distributions of data in a neural network model, accuracy of the neural network model maintains as the bitcell failure rate in the memory system increases.

In some embodiments, a memory device is disclosed, including a memory array and a selection circuit. At least one first faulty cell and at least one second faulty cell that are in the memory array store data corresponding to, respectively, first and second fields of a floating-point number. The selection circuit identifies the at least one first faulty cell and the at least one second faulty cell based on a priority of a cell replacement operation which indicates that a priority of the at least one first faulty cell is higher than that of the at least one second faulty cell. The selection circuit further outputs a fault address of the at least one first faulty cell to a redundancy analyzer circuit that is configured to perform a replacing operation of replacing the at least one first faulty cell.

In some embodiments, the at least one first faulty cell has a stuck-at-1 fault, and the at least one second faulty cell has a stuck-at-0 fault.

In some embodiments, the first field of the floating-point number is an exponent field.

In some embodiments, the selection circuit determines that an address received from a test circuit matches one of a plurality of addresses of a group of memory cells to output the address as the fault address. The group of memory cells store data corresponding to an exponent field of the floating-point number.

In some embodiments, the memory device further includes a spare circuit including multiple spare cells. One of the spare cells stores an accurate value corresponding to the at least one first faulty cell. The spare circuit further replaces a faulty bit corresponding to the at least one first faulty cell with the accurate value.

In some embodiments, the memory device further includes a clipping circuit configured to compare the floating-point number that is read out from the memory array with a first threshold value, and configured to output the first threshold value as a read data when the floating-point number is greater than the first threshold value.

In some embodiments, when the floating-point number is smaller than a second threshold value smaller than the first threshold value, the clipping circuit is further configured to output the second threshold value as the read data.

In some embodiments, the floating-point number corresponds to an input activation used in a neural network model, and the clipping circuit is further configured to compare the floating-point number with a second threshold value, and to output the floating-point number, the first threshold value, or the second threshold value. The first threshold value corresponds to a maximum of data used in the neural network model, and the second threshold value equals to 0.

Also disclosed is a method that includes operations of testing a memory array to identify multiple faulty cells in the memory array; identifying in the faulty cells an excluded cell that meets at least one condition, in which the at least one condition is associated with a value of a first binary number corresponding to the excluded cell; and replacing at least one cell of remaining cells in the faulty cells with a redundant cell.

In some embodiments, the at least one condition indicates that the value of the first binary number corresponding to the excluded cell is smaller than an accurate value of the first binary number corresponding to the excluded cell.

In some embodiments, the at least one condition indicates that a value of an exponent in the first binary number corresponding to the excluded cell is smaller than an accurate value of the exponent in the first binary number corresponding to the excluded cell.

In some embodiments, the at least one condition indicates that the excluded cell is configured to store a bit in a mantissa field of the first binary number, or that the excluded cell is configured to store a bit in a sign field of the first binary number, and the first binary number is used as an activation in a neural network model.

In some embodiments, the at least one condition indicates that the excluded cell stores a low logic value in response to a write operation performed to write a high logic value in the excluded cell.

In some embodiments, the method further includes operations of comparing a value of a second binary number corresponding to the redundant cell with a first threshold value and a second threshold value that are associated with, respectively, a maximum and a minimum of data used in a neural network processor; and outputting, in response to the comparison, the second binary number, the first threshold value, or the second threshold value as a read data to the neural network processor.

Also disclosed is a system that includes a memory device and a neural network processor (10) accessing the memory device. The memory device includes multiple memory cells, a selection circuit, and a replacement circuit. The memory cells store binary numbers corresponding to data transmitted from/to the neural network processor. The selection circuit outputs a fault address of a faulty cell in the memory cells. The faulty cell has a first priority in a cell replacement operation and has a stuck-at-1 fault in a bit in an exponent field of a binary number of the binary numbers. The replacement circuit replaces, according to the fault address, the faulty cell with a redundant cell of redundant cells.

In some embodiments, the system further includes a clipping circuit configured to output to the neural network processor a first threshold value when the binary number is greater than the first threshold value, a second threshold value when the binary number is smaller than the second threshold value, or the binary number when the binary number ranges between the first and second threshold values.

In some embodiments, the first and second threshold values are associated with distribution of input activations used in a neural network model executed in the neural network processor, and the second threshold value equals to 0.

In some embodiments, the system further includes a test circuit configured to compare the binary numbers, that are inputted to the memory device, with the binary numbers that are read from the memory device, and further configured to output, in response to the comparison, addresses, corresponding to faulty cells including the faulty cell, to the selection circuit.

In some embodiments, an excluded cell in the memory cells has a second priority lower than the first priority in the cell replacement operation and has a stuck-at-0 fault. A bit data corresponds to the excluded cell keeps the same in the cell replacement operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array, wherein at least one first faulty cell and at least one second faulty cell that are in the memory array are configured to store data corresponding to, respectively, first and second fields of a floating-point number;
   a selection circuit configured to identify the at least one first faulty cell and the at least one second faulty cell based on a priority of a cell replacement operation which indicates that a priority of the at least one first faulty cell is higher than that of the at least one second faulty cell, and further configured to determine that an address of the at least one first faulty cell matches one of a plurality of addresses of a group of memory cells to output the address of the at least one first faulty cell as a fault address, wherein the group of memory cells store data corresponding to an exponent field of the floating-point number,
   wherein the selection circuit is further configured to output the fault address to a redundancy analyzer circuit that is configured to perform a replacing operation of replacing the at least one first faulty cell; and
   a clipping circuit configured to output the floating-point number read out from the memory array as a read data when the floating-point number is between a first threshold value and a second threshold value smaller than the first threshold value.

2. The memory device of claim 1, wherein the at least one first faulty cell has a stuck-at-1 fault, and the at least one second faulty cell has a stuck-at-0 fault.

3. The memory device of claim 1, wherein the first field of the floating-point number is the exponent field.

4. The memory device of claim 1, further comprising:
   a spare circuit comprising a plurality of spare cells, wherein one of the plurality of spare cells is configured to store an accurate value corresponding to the at least one first faulty cell,
   wherein the spare circuit is further configured to replace a faulty bit corresponding to the at least one first faulty cell with the accurate value.

5. The memory device of claim 1, wherein the clipping circuit is further configured to compare the floating-point number that is read out from the memory array with the first threshold value, and configured to output the first threshold value as the read data when the floating-point number is greater than the first threshold value.

6. The memory device of claim 5, wherein when the floating-point number is smaller than the second threshold value, the clipping circuit is further configured to output the second threshold value as the read data.

7. The memory device of claim 5, wherein the floating-point number corresponds to an input activation used in a neural network model, and
   the clipping circuit is further configured to compare the floating-point number with the second threshold value, and to output the floating-point number, the first threshold value, or the second threshold value,
   wherein the first threshold value corresponds to a maximum of data used in the neural network model, and the second threshold value equals to 0.

8. The memory device of claim 1, wherein the clipping circuit is further configured to output the second threshold value when the floating-point number is smaller than the second threshold value, wherein the second threshold value is unequal to zero.

9. A method, comprising:
   testing a memory array to identify a plurality of faulty cells in the memory array;
   identifying in the plurality of faulty cells an excluded cell that meets at least one of a plurality of conditions, wherein the plurality of conditions are associated with a value of a first binary number corresponding to the excluded cell, wherein a first condition of the plurality of conditions indicates that a value of an exponent in the first binary number corresponding to the excluded cell is smaller than an accurate value of the exponent in the first binary number corresponding to the excluded cell;
   replacing at least one cell of remaining cells in the plurality of faulty cells with a redundant cell; and
   outputting a second binary number corresponding to the redundant cell as a read data to a neural network processor when the second binary number is between a first threshold value and a second threshold value.

10. The method of claim 9, wherein a second condition of the plurality of conditions indicates that the value of the first binary number corresponding to the excluded cell is smaller than an accurate value of the first binary number corresponding to the excluded cell.

11. The method of claim 9, wherein a second condition of the plurality of conditions indicates that the excluded cell is configured to store a bit in a mantissa field of the first binary number, or that the excluded cell is configured to store a bit in a sign field of the first binary number, and the first binary number is used as an activation in a neural network model.

12. The method of claim 9, wherein a second condition of the plurality of conditions indicates that the excluded cell stores a low logic value in response to a write operation performed to write a high logic value in the excluded cell.

13. The method of claim 9, wherein the first threshold value and the second threshold value are associated with, respectively, a maximum and a minimum of data used in the neural network processor.

14. The method of claim 9, wherein the at least one cell of the remaining cells in the plurality of faulty cells has a stuck-at-1 fault.

15. The method of claim 9, wherein a second condition of the plurality of conditions indicates that the excluded cell is configured to store a bit in a mantissa field of the first binary number.

16. A system, comprising:
a memory device; and
a neural network processor configured to access the memory device;
wherein the memory device comprises:
a plurality of memory cells configured to store a plurality of binary numbers corresponding to data transmitted from/to the neural network processor;
a selection circuit configured to determine that a first address of a plurality of addresses received from a test circuit matches one of addresses of first memory cells in the plurality of memory cells to output the first address as a fault address, wherein the first memory cells store data corresponding to exponent fields of the plurality of binary numbers, and the plurality of addresses correspond to a plurality of faulty cells,
wherein the selection circuit is further configured to output the fault address of a first faulty cell in a plurality of faulty cell, wherein the first faulty cell has a first priority in a cell replacement operation and has a stuck-at-1 fault in a bit in the exponent field of a first binary number of the plurality of binary numbers;
a replacement circuit configured to replace, according to the fault address, the first faulty cell with a redundant cell of a plurality of redundant cells; and
a clipping circuit configured to output to the neural network processor a first threshold value when the first binary number is greater than the first threshold value.

17. The system of claim 16, wherein the clipping circuit is further configured to output a second threshold value smaller than the first threshold value when the first binary number is smaller than the second threshold value, or the first binary number when the first binary number ranges between the first and second threshold values.

18. The system of claim 17, wherein the first and second threshold values are associated with distribution of input activations used in a neural network model executed in the neural network processor, and the second threshold value equals to 0.

19. The system of claim 16,
wherein the test circuit is configured to compare the plurality of binary numbers, that are inputted to the memory device, with the plurality of binary numbers that are read from the memory device, and further configured to output, in response to the comparison, the plurality of addresses to the selection circuit.

20. The system of claim 16, wherein an excluded cell, different from the first faulty cell, in the plurality of memory cells has a second priority lower than the first priority in the cell replacement operation and has a stuck-at-0 fault,
wherein a bit data that corresponds to the excluded cell keeps the same value during the cell replacement operation.

\* \* \* \* \*